United States Patent
Kelly et al.

(10) Patent No.: US 10,523,165 B2
(45) Date of Patent: Dec. 31, 2019

(54) COMMON MODE FEEDBACK CIRCUIT WITH BACKGATE CONTROL

(71) Applicant: Analog Devices, Inc., Norwood, MA (US)

(72) Inventors: Daniel F. Kelly, Andover, MA (US); Franklin M. Murden, Roan Mountain, TN (US); Daniel Rey-Losada, San Diego, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/861,493

(22) Filed: Jan. 3, 2018

(65) Prior Publication Data

US 2018/0212577 A1    Jul. 26, 2018

Related U.S. Application Data

(60) Provisional application No. 62/451,042, filed on Jan. 26, 2017.

(51) Int. Cl.
| | |
|---|---|
| *H03F 3/45* | (2006.01) |
| *H03F 1/22* | (2006.01) |
| *H03F 3/68* | (2006.01) |
| *H03G 3/00* | (2006.01) |

(52) U.S. Cl.
CPC ......... *H03F 3/45264* (2013.01); *H03F 1/223* (2013.01); *H03F 3/4565* (2013.01); *H03F 3/45183* (2013.01); *H03F 3/45188* (2013.01); *H03F 3/45659* (2013.01); *H03F 3/68* (2013.01); *H03G 3/004* (2013.01); *H03F 2203/45008* (2013.01); *H03F 2203/45418* (2013.01);

(Continued)

(58) Field of Classification Search
USPC ........................................ 330/253, 258, 260
See application file for complete search history.

(56) References Cited

U.S. PATENT DOCUMENTS

| | | | | |
|---|---|---|---|---|
| 5,610,547 | A | * | 3/1997 | Koyama ............... G06G 7/24 327/103 |
| 5,847,601 | A | | 12/1998 | Wang |
| 6,064,262 | A | | 5/2000 | Wang |

(Continued)

FOREIGN PATENT DOCUMENTS

| | | |
|---|---|---|
| GB | 2533309 | 6/2016 |
| KR | 2007-0018519 | 2/2007 |

OTHER PUBLICATIONS

P.M. VanPeteghem et al., *A General Description of Common-Mode Feedback in Fully-Differential Amplifiers*, CH2868-8/90/0000-3209 © 1990 IEEE, 4 pages.

(Continued)

*Primary Examiner* — Khanh V Nguyen
(74) *Attorney, Agent, or Firm* — Patent Capital Group (57) ABSTRACT

A common mode feedback (CMFB) loop for a differential amplifier sense an output common mode of a differential circuit and provides feedback to the gates of tail current transistors. Many CMFB loops cannot easily adjust the output common mode voltage and the output common mode may vary over process, voltage, and temperature. An improved CMFB circuit adds a control circuit to control backgates of tail current transistor device(s) of the differential circuit such that the output common mode voltage can be made adjustable.

20 Claims, 8 Drawing Sheets

(52) U.S. Cl.
CPC .............. *H03F 2203/45424* (2013.01); *H03F 2203/45474* (2013.01)

(56) References Cited

U.S. PATENT DOCUMENTS

| | | | | |
|---|---|---|---|---|
| 7,911,274 B2* | 3/2011 | Morikawa | ........... | H03F 3/45197 |
| | | | | 330/253 |
| 8,072,269 B2* | 12/2011 | Wu | ........... | H03F 1/26 |
| | | | | 330/253 |
| 8,085,067 B1* | 12/2011 | Stiff | ........... | H03F 3/45179 |
| | | | | 327/51 |
| 8,928,406 B2* | 1/2015 | Albinet | ........... | H03F 3/45636 |
| | | | | 330/253 |
| 2004/0227572 A1* | 11/2004 | Takata | ........... | H03F 3/45748 |
| | | | | 330/253 |
| 2008/0218265 A1* | 9/2008 | Murden | ........... | H03F 3/45242 |
| | | | | 330/253 |
| 2014/0266437 A1 | 9/2014 | Kelly | | |

OTHER PUBLICATIONS

Nagendra Krishnapura, EE539: *Analog Integrated Circuit Design; Common mode feedback circuits*, Apr. 18, 2006 (Nagendra@iitm.ac.in), 14 pages.

Office Action (OA1) issued in CN Patent Application Serial No. 201810075146.0 dated Jun. 27, 2019, 10 pages.

English Translation of KR20070018519 (Description and Claims only—Abstract not available).

\* cited by examiner

COMMON MODE FEEDBACK CIRCUIT WITH BACKGATE CONTROL

PRIORITY DATA

This patent application receives benefit from and/or claim priority to U.S. Provisional Patent Application Ser. No. 62/451,042, filed on Jan. 26, 2017, entitled "PUSH PULL DIFFERENTIAL PAIR AND COMMON MODE FEEDBACK CIRCUIT". This U.S. Provisional Patent Application is incorporated by reference in its entirety.

TECHNICAL FIELD OF THE DISCLOSURE

The present invention relates to the field of integrated circuits, in particular to common mode feedback circuits with backgate control.

BACKGROUND

Direct radio frequency communication systems and wide bandwidth instrumentation systems are two important sources of motivation for designing extremely high speed analog-to-digital converters (ADCs). In one example, such systems may require an ADC which can provide 12-bit resolution running at 10 Gigasamples/second. Certain process nodes can help make circuits in such high speed ADCs run faster, but can pose new challenges for circuit designers. For instance, some process nodes may require lower voltage designs. Limits on power consumption or general preference for lowering power consumption may also require lower voltage designs. At the same time, circuit designers aim to design circuits which can perform well.

One important part of an ADC are the amplifiers, which are used to amplify signals. One may find amplifiers connecting stages of a pipeline ADC, or other ADC architectures. The amplifier is an important part of the signal chain in an ADC, and many other analog circuits. Performance of the amplifier can directly affect many performance metrics of the overall system.

To achieve certain benefits such as even order harmonics cancellations, differential or balanced circuits are often used to implement amplifiers. For differential circuits, including differential buffers, differential amplifiers, and push pull differential amplifiers, common mode of a differential voltage may need to be adjusted for optimal performance or requirements of the overall circuit. Common mode of a differential voltage is a common voltage that appears in both signals, i.e., both the + and − parts of the differential voltage. Common mode adjustments or controls may be particularly useful when multiple stages of differential circuits are cascaded one after another, and one stage may impose common mode requirements on another stage. Common mode feedback (CMFB) circuits are used for adjusting/controlling common mode of differential voltages. Specifically, a CMFB circuit (sometimes referred to as a CMFB loop) can be are added to differential circuits to adjust input common mode and/or output common mode of the differential circuits.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

A common mode feedback (CMFB) loop for a differential amplifier senses an output common mode of a differential circuit and provides feedback to the gates of tail current transistors. Many CMFB loops cannot easily adjust the output common mode voltage and the output common mode may vary over process, voltage, and temperature. An improved CMFB circuit adds a control circuit to control backgates of tail current transistor device(s) of the differential circuit such that the output common mode voltage can be made adjustable.

According to some embodiments, an improved CMFB circuit is provided to a differential amplifier, where the differential amplifier includes a differential pair of transistors whose gates receive a differential input voltage and the drains of the transistors of the differential pair form the differential output nodes generating a differential output voltage. The differential amplifier further includes a pair of tail current transistors (whose drains are connected to the sources of respective transistors of the differential pair). The tail current transistors are connected in negative feedback configuration, where the gates of the tail current transistors are coupled to the differential output nodes. The output common mode of the CMFB circuit corresponds to the gate to source voltage of the tail current transistors. The backgates of the tail current transistors are connected to or driven by a control circuit, such that the gate to source voltages can be adjustable. Accordingly the output common mode is also adjustable and can track over process, voltage, and temperature.

In some embodiments, the CMFB circuit includes sensing circuitry to sense the output common mode and an operational amplifier (opamp) that can adjust/control the backgate voltages of tail current transistors to drive the sensed output common mode to match the target output common mode. In one example, the CMFB circuit includes sense resistors coupled to the differential output nodes to generate a sensed output common mode voltage, and an opamp that receives the sensed output common mode voltage and a target common mode voltage. The opamp controls the backgates of the tail current transistors to drive sensed output common mode to match to the target common mode voltage. In another example, the sensing circuitry includes a replica bias circuit to sense a copy of the output common mode voltage, which is in turn used as the sensed common mode voltage at the input of the opamp for driving the sensed common mode voltage to match the target common mode voltage. In yet another example, the opamp controls the backgate voltages of a tail current transistor in the main differential branches and a tail current transistor in the replica branch to drive the sensed output common mode to match the target output common mode.

Limitations of Some CMFB Circuits

Figure 1:
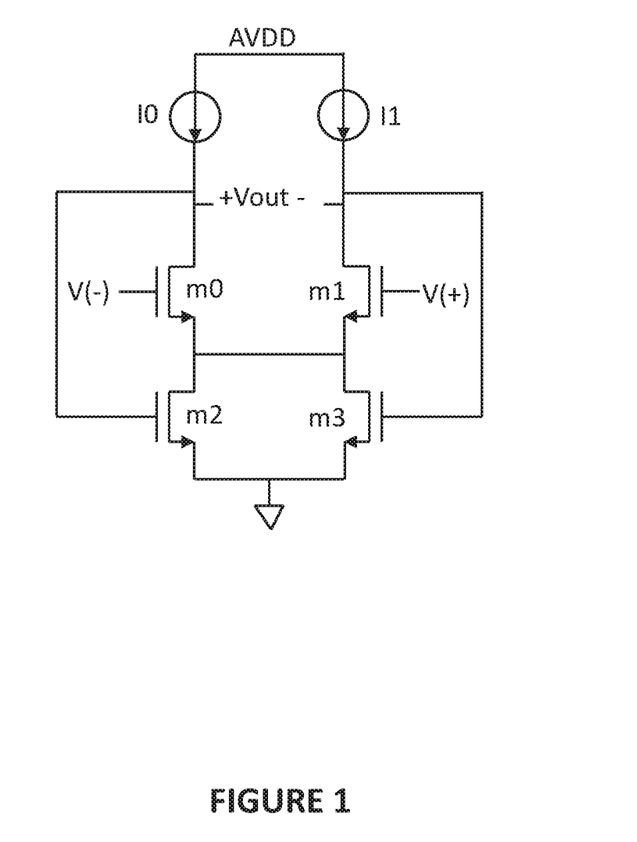
FIG. 1 shows an exemplary differential amplifier having common mode feedback.
Figure 7:
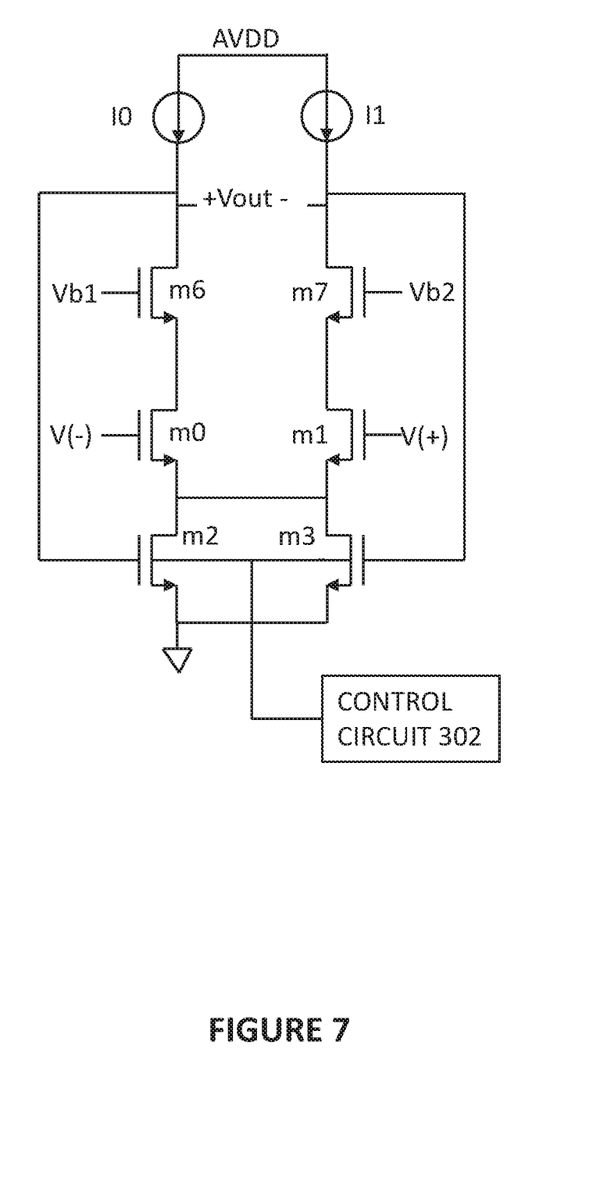
FIG. 7 shows a further exemplary differential amplifier having common mode feedback with backgate control, according to some embodiments of the disclosure.

FIG. 1 shows an exemplary differential amplifier having common mode feedback (CMFB). The differential amplifier as shown has a low swing. Such a low swing differential amplifier is often used as the input stage of a two stage amplifier. Transistors m0 and m1 form a differential pair, referred herein as a differential pair of transistors. The differential pair of transistors have gates that receive a differential input voltage. As shown, the gate of m0 receives the negative part V(−) of the differential input voltage and the gate of m1 receives the positive part V(+) of the differential input voltage. Furthermore, the differential pair of transistors have drains that can form the differential output nodes of the differential amplifier. As shown in this example, the drain of m0 and the drain of m1 form the differential output nodes (indicated as +Vout−, or referred herein as the positive differential output node and the negative differential output node). The differential pair of transistors m0 and m1 are in a common source configuration, or in other words, the sources of the differential pair of transistors are tied/coupled together. FIG. 7 shows a similar configuration, where the differential pair of transistors are cascoded.

Transistors m2 and m3 are the tail current transistors and can form a part of the CMFB circuit for the differential amplifier. The drains of the tail current transistors m2 and m3 are connected to respective sources of the differential pair of transistors m0 and m1. The gates the tail current transistors m2 and m3 are coupled to the differential output nodes. As shown, the gate of m2 is tied to the positive differential output node, and the gate of m3 is tied to the negative differential output node. The tail current transistors m2 and m3 are in a common source configuration, or in other words, the sources of m2 and m3 are tied/coupled together. The tail current transistors m2 and m3 are in a common drain configuration, or in other words, the drains of m2 and m3 are tied/coupled together. To the output common mode at the differential output nodes, the tail current transistors m2 and m3 are connected in negative feedback and the output common mode is set to equal to the Vgs (gate to source voltage) of m2 and m3.

Further to the differential pair of transistors and the tail current transistors, the differential amplifier includes current sources I0 and I1 for supplying current for the respective transistors of the differential pair of transistors (m0 and m1 respectively).

One issue relating to the circuit seen in FIG. 1 is that the output common mode being set by the Vgs of m2 and m3 can be quite limiting. The Vgs is determined by device parameters such as Vt (threshold voltage), W/L (width and length ratio) and the drain current. To achieve the desired Vgs, i.e., the output common mode of the amplifier, a solution may require non-optimal sizing and drain current for m2 and m3. In addition, the variation of the Vgs over process, voltage, and temperature (PVT) may be unacceptable since such variation can greatly affect the output common mode.

Figure 2:
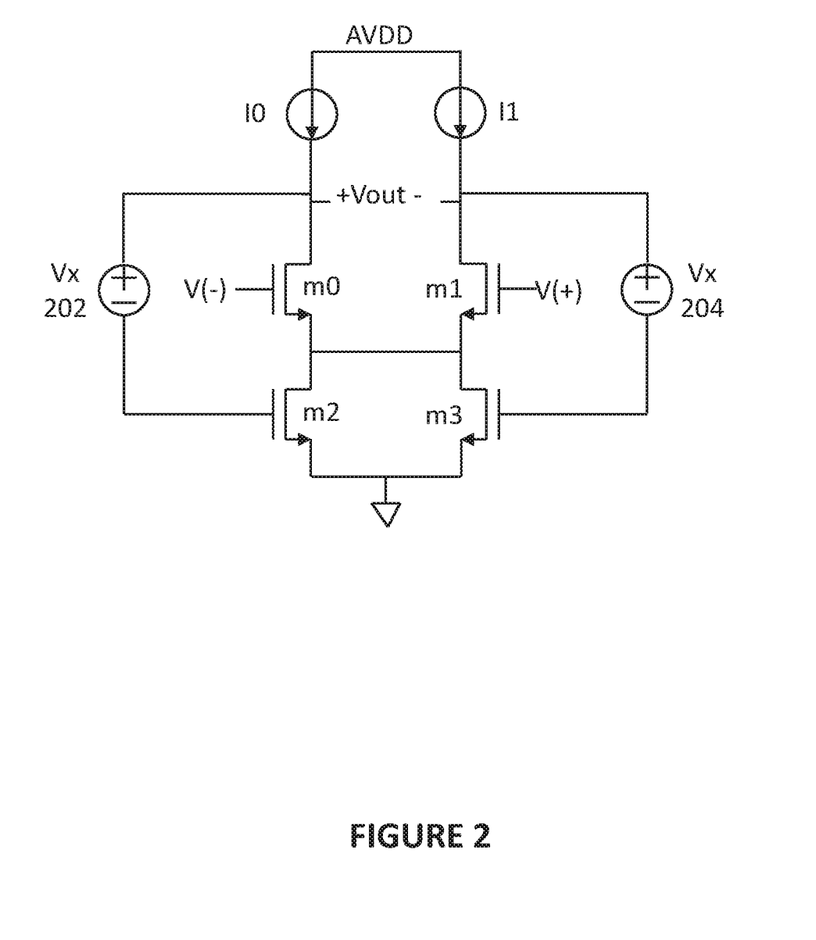
FIG. 2 shows another differential amplifier having common mode feedback.

FIG. 2 shows another differential amplifier having common mode feedback. One solution for this Vgs limitation is to insert batteries or ideal voltage sources Vx 202 and Vx 204. With the batteries inserted between the positive differential output node and the gate of m2 and between the negative differential output node and the gate of m3, the output common mode is equal to Vgs+Vx, Vx being a voltage supplied by a voltage source or battery. The battery can be made by a number of different circuit techniques. With the use of batteries as shown, it is possible to achieve the desired common mode while maintain some optimum sizing, drain current, and Vgs for m2 & m3. However, the output common mode voltage would still vary over PVT, which may not be optimal or acceptable in some scenarios. The output common mode voltage is not easily adjusted unless Vx is made variable, which can complicate the circuit design greatly.

Improved CMFB Circuits with Backgate Control

Figure 3:
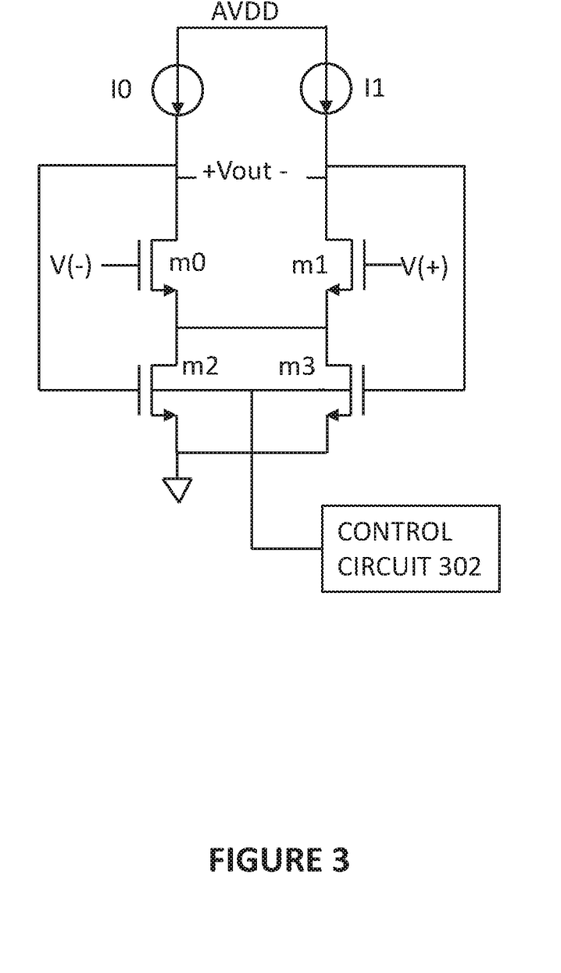
FIG. 3 shows an exemplary differential amplifier having common mode feedback with backgate control, according to some embodiments of the disclosure.

FIG. 3 shows an exemplary differential amplifier having common mode feedback with backgate control, according to some embodiments of the disclosure. To provide more flexibility to the CMFB circuit, a control circuit 302 is included to control backgates of the tail current transistors m2 and m3. Adjusting the backgates of m2 and m3 can in turn adjust the Vt and the Vgs of m2 and m3. As explained previously with FIG. 1, the output common mode is set to the Vgs of m2 and m3. With the addition of control circuit 302, the Vgs of m2 and m3 is adjustable by the control circuit 302. The control circuit 302 can be designed to vary the Vgs of m2 and m3 over a fairly wide range allowing for an adjustable common mode voltage. The control circuit 302 can also be designed to track over PVT. In some cases, one single control circuit 302 can control both the backgates of m2 and m3. In other words, the tail current transistors are controlled by a common output from the control circuit 302.

The control circuit 302 can include means for generating common mode feedback from differential output nodes of the differential amplifier, and control means coupled to backgates of tail current transistors for varying an output common mode voltage of the differential amplifier based on the common mode feedback. The means for varying the output common mode voltage comprises means for driving the backgates of tail current devices until the common mode feedback reaches a target output common mode voltage. Exemplary implementations for such means are illustrated by FIGS. 4-6.

Figure 4:
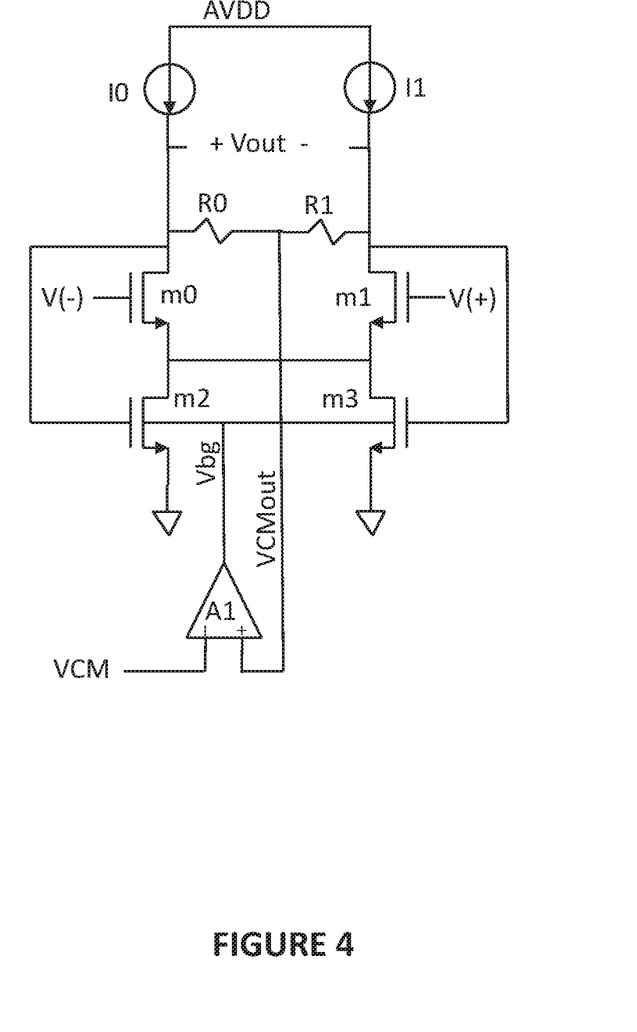
FIG. 4 shows another exemplary differential amplifier having common mode feedback with backgate control, according to some embodiments of the disclosure.

FIG. 4 shows another exemplary differential amplifier having common mode feedback with backgate control, according to some embodiments of the disclosure. Specifically, FIG. 4 shows an embodiment where the control circuit 302 from FIG. 3 has an operational amplifier (opamp) A1 and common mode sense resistors R0 and R1. The output common mode voltage VCMout is sensed by R0 and R1. The opamp A1 generates an output voltage Vbg, and drives the backgates of the tail current transistors m2 and m3 until the sensed common mode voltage VCMout of the differential output nodes reaches a target output common mode voltage VCM. In otherwords, the opamp A1 drives the backgates of m2 and m3 until VCMout=VCM.

In some cases, the resistors R0 and R1 may reduce the differential gain at the output, which may be undesirable in a high gain stage. The resistors could be replaced by a switched capacitor circuit to address this issue. In some cases, a replica bias could be used to sense the common mode instead (which is shown in FIGS. 5 and 6). Referring back to FIG. 4, the control circuit can be designed to track over PVT while maintaining the output common mode constant and equal to VCM, as long as there is sufficient gain from backgates of m2 and m3 to VCMout and the swing of opamp A1 is capable of going below ground.

Figure 5:
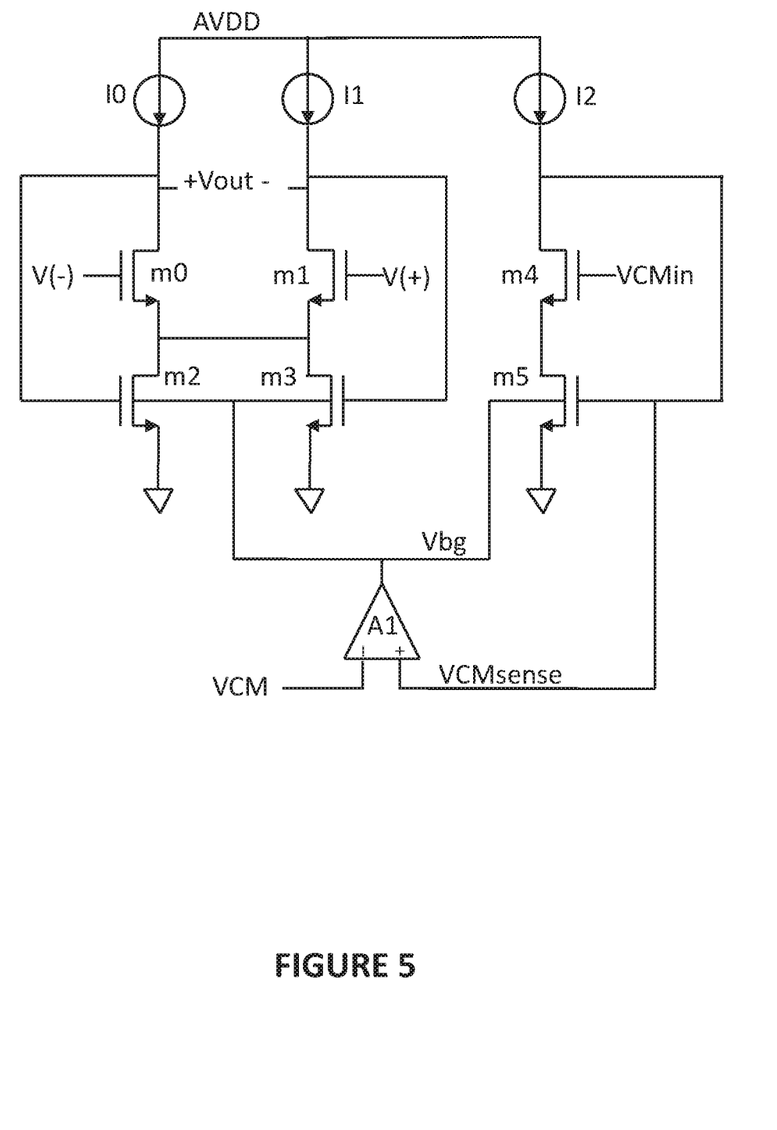
FIG. 5 shows another exemplary differential amplifier having common mode feedback with backgate control, according to some embodiments of the disclosure.
Figure 6:
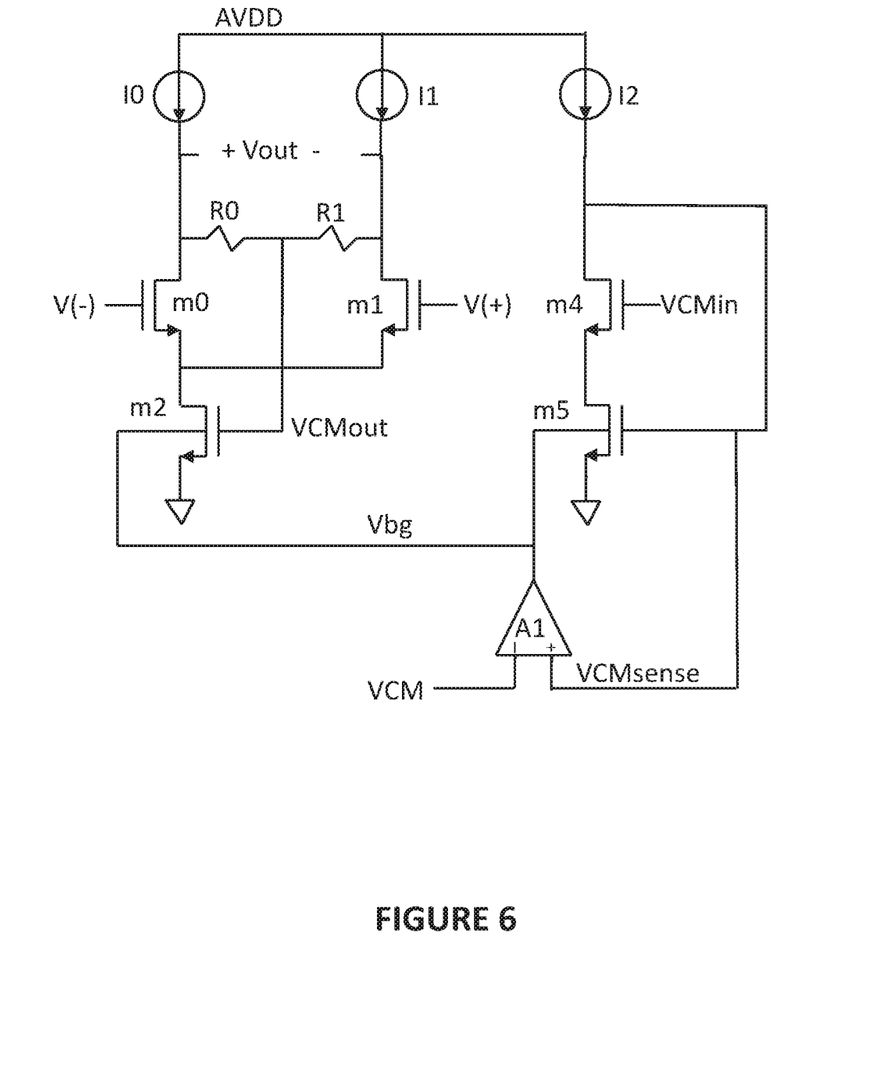
FIG. 6 shows yet another exemplary differential amplifier having common mode feedback with backgate control, according to some embodiments of the disclosure.

FIG. 5 shows another exemplary differential amplifier having common mode feedback with backgate control, according to some embodiments of the disclosure. The CMFB circuit includes a replica bias circuit that provides the sensed common mode voltage VCMsense. The replica bias circuit senses a copy of the output common mode voltage of the differential output nodes. Specifically, the replica bias circuit replicates at least a part of the differential amplifier. In this example, the replica bias circuit has transistor m4, tail current transistor m5, and current source I2. Transistor m4, tail current transistor m5, and current source I2 are sized to run at the same current density as the devices in the differential amplifier (i.e., m0, m2, I0, and m1, m3, and I1). Transistor m4's gate can be driven by an input common mode voltage VCMin. Opamp A1 servoes/drives the backgates of tail current transistors m2, m3, and m5 with Vbg until VCMsense=VCM. VCMout (the output common mode) would also equal VCM as long as m2, m3, and m5 are matched and at the same current density.

The circuit seen in FIG. 5 can have some advantages over the circuit of FIG. 4. First, since there are no resistors (e.g., R0 and R1) sensing the common mode in FIG. 5, the differential amplifier can be designed for higher gain. Second, the common mode sense circuit is separate from the signal path and can thus be immune to large signal glitches. Third, it can also be low power by scaling.

This circuit in FIG. 5 can be designed to track over PVT while maintaining the output common mode constant and equal to VCM as long as the devices match, and there is sufficient gain from backgate to VCMsense, and the opamp swing is capable of going below ground.

FIG. 6 shows yet another exemplary differential amplifier having common mode feedback with backgate control, according to some embodiments of the disclosure. For some cases, a wide swing is required or desirable with relatively low gain. As shown in FIG. 6, resistors R0 and R1 are used to sense the output common mode VCMout, and VCMout drives the (front) gate of tail current transistor m2. The control circuit has opamp A1 and replica bias (which includes current source I2, transistor m4, and tail current transistor m5). VCM is a target common mode voltage. The control circuit, i.e., the opamp A1 provides Vbg and drives the backgates of tail current transistor m2 and replica tail current transistor m5 until the Vgs of m5 (which is node VCMsense) reaches VCM. If transistor m2 and transistor m5 are matched and at equal current density, and transistor m0, transistor m1, and transistor m4 are matched and at equal current density, then the output common mode voltage VCMout would also equal VCM.

FIG. 7 shows a further exemplary differential amplifier having common mode feedback with backgate control, according to some embodiments of the disclosure. In some embodiments where there is sufficient headroom, the differential pair of transistors are cascoded or actively cascoded. As seen in FIG. 7, cascode transistor m6 and cascode transistor m7 are added to m0 and m1 respectively. In other words, the differential pair of transistors are cascoded. The gates of m6 and m7 can be driven by appropriate bias voltages Vb1 and Vb2 (which may be different voltages or the same voltages) respectively to ensure proper operation. Sources of m6 and m7 are connected to the respective drains of m0 and m1. Drain of m6 and the drain of m7 form the differential output nodes (indicated as +Vout−, or referred herein as the positive differential output node and the negative differential output node). The gates of m2 and m3 are connected to the respective drains of m6 and m7. The control circuit 302 can include circuitry which senses the output common mode voltage at the drains of m6 and m7. Adding the cascode transistors m6 and m7 can improve performance of the differential amplifier. The functionality of backgate control is the same or similar to the embodiments illustrated by FIGS. 3-6.

With reference to FIG. 4, the common mode sense resistors R0 and R1 can sense the output common mode voltage VCMout at the differential output nodes. In the case of FIG. 7, when the differential pair of transistors are cascoded as seen in FIG. 7, the differential output nodes are at the drains of m6 and m7 (the cascode transistors), and R0 and R1 would be connected to respective drains of m6 and m7.

With reference to FIGS. 5 and 6, the replica bias circuit replicates at least a part of the differential amplifier. In the case of FIG. 7, when the differential pair of transistors are cascoded as seen in FIG. 7, the replica bias circuit would also replicate the cascode transistor. For instance, the replica bias circuit can replicate I0, m6, m0, and m2, or replicate I1, m7, m1, and m3.

Exemplary Method for CMFB with Backgate Control

Figure 8:
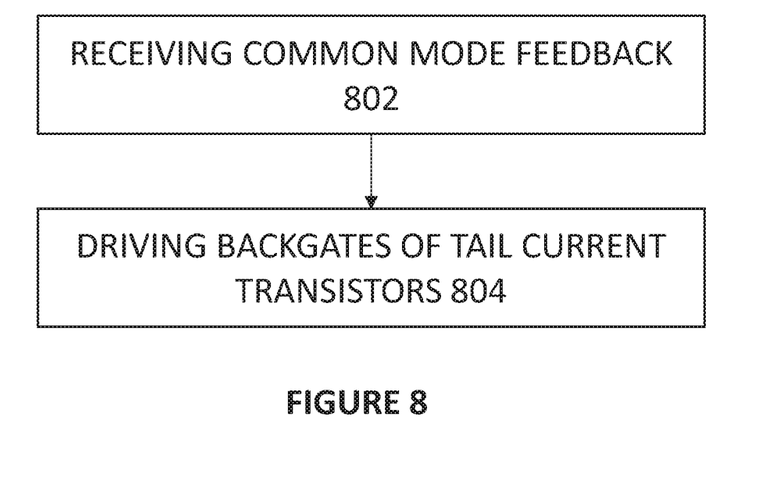
FIG. 8 shows a flow diagram illustrating a method for common mode feedback and backgate control, according to some embodiments of the disclosure.

FIG. 8 shows a flow diagram illustrating a method for common mode feedback and backgate control for a differential amplifier, according to some embodiments of the disclosure. In 802, common mode feedback of differential output nodes of the differential amplifier is received. In other words, feedback of the output common mode is provided to a control circuit. For some cases, the common mode feedback is generated by sense resistors coupled to the differential output nodes. For some cases, the common mode feedback is generated by a replica bias circuit sensing a copy of an output common mode voltage of the differential output nodes. In 804, a control circuit drives one or more backgates of one or more tail current transistors of the differential amplifier based on the common mode feedback and a target output common mode voltage. In some cases, the control circuit can drive driving a backgate of a further tail current transistor in the replica bias circuit based on the common mode feedback and the target output common mode voltage.

In 804, driving the one or more backgates can include varying a voltage at the one or more backgates until the common mode feedback reaches the target output common mode voltage. In some embodiments, driving the one or more backgates can include changing gate to source voltages and/or threshold voltages of the tail current transistors. In some embodiments, driving the one or more backgates can include varying gate to source voltages and/or threshold voltages of the tail current transistors over one or more of the following: power, voltage, and temperature. As a result, the backgate control provides a variable output common mode voltage for the differential amplifier. The control circuit can be designed to track over PVT while maintaining the output common mode constant and equal to the target output common mode voltage.

In some embodiments, the method includes receiving a differential input voltage at a differential pair of transistors of the differential amplifier, wherein drains of the differential pair of transistors form the differential output nodes of the differential amplifier. The differential pair of transistors are seen as m0 and m1 in the FIGURES. In some embodiments, the one or more gates of the one or more tail current transistors are coupled to the differential output nodes. In other words, the tail current transistors are in negative feedback configuration, as illustrated in the FIGURES. In some embodiments, the one or more gates of the one or more tail current transistors are driven by the common mode feedback (e.g., as seen in FIG. 6).

EXAMPLES

Example 1 is a differential amplifier having common mode feedback and backgate control, comprising: differential pair of transistors whose gates receive a differential input voltage, tail current transistors whose drains are connected to respective sources of the differential pair of transistors and gates are coupled to differential output nodes of the differential amplifier, and a control circuit controlling backgates of the tail current transistors. In some cases, the drains of the differential pair of transistors can form the differential output nodes of the differential amplifier. In some cases, the differential pair of transistors are cascoded, thus the drains of cascode transistors form the differential output nodes of the differential amplifier. In some cases, a single tail current transistor is provided (see FIG. 6).

In Example 2, the differential amplifier of Example 1 can further include current sources supplying current for the respective transistors of the differential pair of transistors.

In Example 3, the differential amplifier of Example 1 or 2 can further include the differential pair of transistors having sources which are coupled together.

In Example 4, the differential amplifier of any one of Examples 1-3 can further include the tail current transistors having sources which are coupled together.

In Example 5, the differential amplifier of any one of Examples 1-4 can further include the tail current transistors being controlled by a common output from the control circuit.

In Example 6, the differential amplifier of any one of Examples 1-5 can further include the control circuit comprising: an operational amplifier driving the backgates of the tail current transistors until a sensed common mode voltage of the differential output nodes reaches a target output common mode voltage.

In Example 7, the differential amplifier of Example 6 can further include the sensed common mode voltage is provided by a replica bias circuit sensing a copy of an output common mode voltage of the differential output nodes.

Example 8 is a method for common mode feedback and backgate control for a differential amplifier, the method comprising: receiving common mode feedback of differential output nodes of the differential amplifier; and driving one or more backgates of one or more tail current transistors of the differential amplifier based on the common mode feedback and a target output common mode voltage.

In Example 9, the method in Example 8 can further include generating the common mode feedback by sense resistors coupled to the differential output nodes.

In Example 10, the method in Example 8 or 9 can further include generating the common mode feedback by a replica bias circuit sensing a copy of an output common mode voltage of the differential output nodes.

In Example 11, the method in any one of Examples 8-10 can further include driving a backgate of a further tail current transistor in a replica bias circuit based on the common mode feedback and the target output common mode voltage.

In Example 12, the method in any one of Examples 8-11 can further include driving the one or more backgates comprising: varying a voltage at the one or more backgates until the common mode feedback reaches the target output common mode voltage.

In Example 13, the method in any one of Examples 8-12 can further include driving the one or more backgates comprising: changing gate to source voltages and/or threshold voltages of the tail current transistors.

In Example 14, the method in any one of Examples 8-13 can further include driving the one or more backgates comprising: varying gate to source voltages and/or threshold voltages of the tail current transistors over one or more of the following: power, voltage, and temperature.

In Example 15, the method in any one of Examples 8-14 can further include receiving a differential input voltage at a differential pair of transistors of the differential amplifier, wherein drains of the differential pair of transistors form the differential output nodes of the differential amplifier.

In Example 16, the method in any one of Examples 8-15 can further include the one or more tail current transistors having gate(s) which are coupled to the differential output nodes.

In Example 17, the method in any one of Examples 8-16 can further include the one or more tail current transistors having gate(s) which are driven by the common mode feedback.

Example 18 is an apparatus comprising: a differential amplifier; means for generating common mode feedback from differential output nodes of the differential amplifier; and control means coupled to backgates of tail current transistors for varying an output common mode voltage of the differential amplifier based on the common mode feedback.

In Example 19, the apparatus of Example 18 can further include the control means for varying the output common mode voltage comprising means for driving the backgates of tail current devices until the common mode feedback reaches a target output common mode voltage.

In Example 20, the apparatus of Example 18 or 19 can further include the means for generating the common mode feedback comprising circuitry replicating at least a part of the differential amplifier.

Example 21 is an apparatus comprising means for implementing and/or carrying out any one of the methods in Examples 8-17.

Variations, Applications, and Implementations

ADCs can be found in many places such as broadband communication systems, audio systems, receiver systems, etc. ADCs can translate analog electrical signals representing real-world phenomenon, e.g., light, sound, temperature or pressure for data processing purposes. Designing an ADC is a non-trivial task because each application may have different needs in performance, power, cost and size. ADCs are used in a broad range of applications including communications, energy, healthcare, instrumentation and measurement, motor and power control, industrial automation and aerospace/defense.

Note that the activities discussed above with reference to the FIGURES of the present disclosure can be applicable to any integrated circuits that are used for data conversion. For instance, ADCs having differential amplifiers like the ones illustrated herein can benefit from the common mode feedback circuits described herein. In certain contexts, the features discussed herein can be applicable to medical systems, scientific instrumentation, wireless communications, and wired communications, radar, industrial process control, audio and video equipment, current sensing, instrumentation, etc.

In the discussions of the embodiments of the present disclosure, the capacitors, clocks, DFFs, dividers, inductors, resistors, amplifiers, switches, digital core, transistors, and/ or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure. It is understood by one skilled in the art that a transistor device can be generalized as a device having three main terminals: drain, source, and gate. Drain and source can be considered as an input/output terminals, and gate can be considered as a control terminal. A transistor device can also have a backgate. A backgate can be considered a control terminal.

It is also imperative to note that all of the specifications, dimensions, and relationships outlined herein (e.g., the number of devices, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions described herein, e.g., functions relating to FIG. 8, illustrate only some of the possible functions that may be carried out by the circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A differential amplifier having common mode feedback and backgate control, comprising:
    differential pair of transistors whose gates receive a differential input voltage;
    tail current transistors whose drains are connected to respective sources of the differential pair of transistors and gates are coupled to differential output nodes of the differential amplifier; and
    a control circuit to sense an output common mode voltage of the differential amplifier and to control backgates of the tail current transistors based on the sensed output common mode voltage.

2. The differential amplifier of claim 1, further comprises:
    current sources to supply current for the respective transistors of the differential pair of transistors.

3. The differential amplifier of claim 1, wherein the differential pair of transistors have sources which are coupled together.

4. The differential amplifier of claim 1, wherein the tail current transistors have sources which are coupled together.

5. The differential amplifier of claim 1, wherein the tail current transistors are controlled by a common output from the control circuit.

6. The differential amplifier of claim 1, wherein the control circuit comprises:
    an operational amplifier to drive the backgates of the tail current transistors until the sensed output common mode voltage of the differential output nodes reaches a target output common mode voltage.

7. The differential amplifier of claim 6, wherein the sensed output common mode voltage is provided by a replica bias circuit sensing a copy of an output common mode voltage of the differential output nodes.

8. A method for common mode feedback and backgate control for a differential amplifier, the method comprising:
    sensing output common mode voltage of differential output nodes of the differential amplifier;
    receiving the sensed output common mode voltage as feedback; and
    controlling a backgate of a tail current transistor of the differential amplifier based on the sensed output common mode voltage to drive the sensed output common mode voltage to match a target output common mode voltage.

9. The method of claim 8, wherein the sensing comprises:
    sensing the output common mode voltage by sense resistors coupled to the differential output nodes.

10. The method of claim 8, wherein the sensing comprises:
    sensing, by a replica bias circuit, a copy of the output common mode voltage of the differential output nodes.

11. The method of claim 8, further comprising:
driving a backgate of a further tail current transistor in a replica bias circuit based on the sensed output common mode voltage and the target output common mode voltage.

12. The method of claim 8, wherein controlling the backgate comprises:
varying a voltage at the backgate until the sensed output common mode voltage reaches the target output common mode voltage.

13. The method of claim 8, wherein controlling the the backgate comprises:
changing gate to source voltages and/or threshold voltages of the tail current transistor.

14. The method of claim 8, wherein controlling the backgate comprises:
varying gate to source voltages and/or threshold voltages of the tail current transistor over one or more of the following: power, voltage, and temperature.

15. The method of claim 8, further comprising:
receiving a differential input voltage at a differential pair of transistors of the differential amplifier, wherein drains of the differential pair of transistors form the differential output nodes of the differential amplifier.

16. The method of claim 8, wherein the tail current transistor has a gate which is coupled to the differential output nodes.

17. The method of claim 8, wherein the tail current transistor has a gate which is driven by the feedback.

18. An apparatus comprising:
a differential amplifier;
means for sensing an output common mode voltage of the differential amplifier;
means for providing the sensed output common mode voltage as feedback to control means; and
the control means coupled to backgates of tail current devices for varying an output common mode voltage of the differential amplifier based on the sensed output common mode voltage.

19. The apparatus of claim 18, wherein the control means for varying the output common mode voltage comprises means for driving the backgates of tail current devices until the sensed output common mode voltage reaches a target output common mode voltage.

20. The apparatus of claim 18, wherein the means for sensing the output common mode voltage comprises circuitry replicating at least a part of the differential amplifier.

* * * * *